United States Patent
Matsuura

(10) Patent No.: US 10,424,489 B2
(45) Date of Patent: Sep. 24, 2019

(54) PLASMA ETCHING METHOD

(71) Applicant: ZEON CORPORATION, Chiyoda-ku, Tokyo (JP)

(72) Inventor: Go Matsuura, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 16/077,740

(22) PCT Filed: Mar. 8, 2017

(86) PCT No.: PCT/JP2017/009330
§ 371 (c)(1),
(2) Date: Aug. 14, 2018

(87) PCT Pub. No.: WO2017/159511
PCT Pub. Date: Sep. 21, 2017

(65) Prior Publication Data
US 2019/0027368 A1  Jan. 24, 2019

(30) Foreign Application Priority Data
Mar. 16, 2016 (JP) .................. 2016-052931

(51) Int. Cl.
H01L 21/3065 (2006.01)
H01L 21/02 (2006.01)
(Continued)

(52) U.S. Cl.
CPC .......... *H01L 21/3065* (2013.01); *H01J 37/32* (2013.01); *H01L 21/0214* (2013.01);
(Continued)

(58) Field of Classification Search
CPC ......... H01L 21/02164; H01L 21/28238; H01L 21/31053; H01L 21/0214; H01L 2924/1067
See application file for complete search history.

(56) References Cited

U.S. PATENT DOCUMENTS 6,186,264 B1    2/2001  Fujiwara et al.
6,287,980 B1 *  9/2001  Hanazaki ............ H01J 37/3244
                                                156/345.28
(Continued)

FOREIGN PATENT DOCUMENTS

JP   H09219394 A   8/1997
JP   H10329780 A   12/1998
JP   5440170 B2    3/2014

OTHER PUBLICATIONS

Sep. 18, 2018, International Preliminary Report on Patentability issued in the International Patent Application No. PCT/JP2017/009330.

*Primary Examiner* — Binh X Tran
(74) *Attorney, Agent, or Firm* — Kenja IP Law PC

(57) ABSTRACT

A plasma etching method uses, as a processing gas, a mixed gas of at least one fluorocarbon gas and at least one hydrofluoroether gas represented by chemical formula (I).

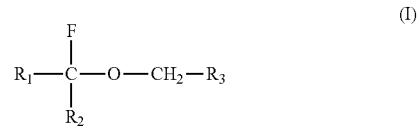

4 Claims, 1 Drawing Sheet

(51) Int. Cl.
  *H01L 21/28* (2006.01)
  *H01L 21/3213* (2006.01)
  *H01L 21/768* (2006.01)
  *H05H 1/46* (2006.01)
  *H01J 37/32* (2006.01)
  *H01L 21/311* (2006.01)
  *C09K 13/00* (2006.01)

(52) U.S. Cl.
  CPC .. *H01L 21/28238* (2013.01); *H01L 21/31116* (2013.01); *H01L 21/3213* (2013.01); *H01L 21/768* (2013.01); *H05H 1/46* (2013.01); *C09K 13/00* (2013.01); *H01J 2237/3347* (2013.01)

(56) References Cited

U.S. PATENT DOCUMENTS

| | | | |
|---|---|---|---|
| 6,514,425 B1* | 2/2003 | Sekiya | H01L 21/3065 216/67 |
| 2010/0264116 A1 | 10/2010 | Suzuki et al. | |
| 2012/0298911 A1* | 11/2012 | Hibino | C09K 13/00 252/79.1 |
| 2016/0027546 A1* | 1/2016 | Teshima | C25D 5/02 378/154 |
| 2017/0243756 A1* | 8/2017 | Matsuura | H01L 21/3065 |

\* cited by examiner

PLASMA ETCHING METHOD

TECHNICAL FIELD

The present disclosure relates to a plasma etching method and, in particular, relates to a method for selectively plasma etching a silicon oxide film.

BACKGROUND

In semiconductor device manufacturing, plasma etching using a processing gas may be carried out in fine processing of a thin film formed on a workpiece. The thin film may, for example, be a silicon compound film such as a silicon nitride film or a silicon oxide film, or may be an organic film having carbon as a main component that is formed from amorphous carbon, a photoresist composition, or the like. Of these examples, in a case in which a silicon oxide film is an etching processing target, it is necessary to selectively etch the processing target silicon oxide film relative to a non-processing target film formed on the same workpiece, such as a silicon nitride film or an organic film. In other words, it is necessary to increase the selectivity in etching.

For this reason, various processing gases for plasma etching have previously been proposed with the aim of sufficiently increasing selectively in etching, and enabling sufficiently selective and efficient etching of a processing target (for example, refer to PTL 1). PTL 1 describes a plasma etching method in which a fluorocarbon such as $C_4F_6$, $C_4F_8$, or $C_5F_8$, or a hydrofluorocarbon such as $CH_3F$ or $C_5HF_7$ is used as a processing gas in etching of a silicon oxide film.

Moreover, demand for weight-reduction, miniaturization, and densification of semiconductor devices has been increasing in recent years. In association with this demand, it is becoming important not only to improve selectivity in etching, but also to improve the accuracy of processed shape obtained through etching when a fine structure such as a self-aligned contact hole is formed by etching on a workpiece including a silicon compound film or an organic film. In general, a protective film is formed on a non-processing target in order to prevent etching of the non-processing target in plasma etching. However, particularly in the case of self-aligned contact hole processing, it is difficult to form a protective film on shoulders of a spacer formed by a silicon nitride film. Consequently, when a processing target silicon oxide film adjacent to the silicon nitride film forming the spacer is etched, shoulders of the silicon nitride film forming the spacer are also susceptible to etching. In some cases, this results in thinning or loss of shoulders of the spacer by a stage at which the etching process ends (for example, refer to PTL 2 and PTL 3). In the present specification, the loss of shoulders (corners) of a structure such as a spacer formed by a non-processing target is also referred to hereinafter as "faceting". In general, a spacer is used to insulate a gate material and metal wire that may be formed by embedding a metal wire material in a contact hole. Accordingly, thinning or loss of the spacer may cause a short-circuit between the gate material and the metal wire, leading to loss of function as a semiconductor device. Therefore, faceting has become a significant issue in semiconductor device manufacturing.

CITATION LIST

Patent Literature

PTL 1: JP 5440170 B
PTL 2: JP H9-219394 A
PTL 3: JP H10-329780 A

SUMMARY

Technical Problem

However, in a plasma etching method such as disclosed in PTL 1 in which a mixed gas including a fluorocarbon gas or hydrofluorocarbon gas has conventionally been used as a processing gas in order to increase the selectivity of etching, there is room for improvement in terms of inhibiting faceting of a structure formed by a non-processing target during plasma etching of a silicon oxide film.

Accordingly, an objective of the present disclosure is to provide a plasma etching method that can sufficiently inhibit faceting during plasma etching of a silicon oxide film.

Solution to Problem

The inventor conducted diligent investigation with the aim of solving the problems set forth above. Through this investigation, the inventor discovered that faceting of a structure formed by a non-processing target can be sufficiently inhibited by using, as a processing gas for plasma etching, a mixture of a fluorocarbon gas and a hydrofluoroether gas that satisfies certain conditions relating to molecular structure.

Specifically, the present disclosure aims to advantageously solve the problems set forth above by disclosing a plasma etching method comprising plasma etching a workpiece including a silicon oxide film that is a processing target and a non-processing target using, as a processing gas, a mixed gas of at least one fluorocarbon gas and at least one hydrofluoroether gas represented by chemical formula (I).

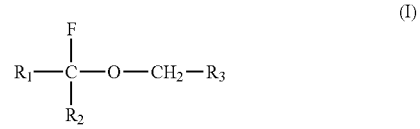

(I)

[In chemical formula (I): $R_1$ represents a hydrogen atom, a fluorine atom, or a fluoroalkyl group $C_xF_{2x+1}$; $R_2$ represents a hydrogen atom, a fluorine atom, or a fluoroalkyl group $C_yF_{2y+1}$; and $R_3$ represents a hydrogen atom, a fluorine atom, or a fluoroalkyl group $C_zF_{2z+1}$. Moreover, x, y, and z are each an integer of at least 0 and not more than 3 and satisfy $1 \leq x+y+z \leq 3$. Furthermore, $R_1$, $R_2$, and $R_3$ may be the same or different.]

By plasma etching a silicon oxide film using a mixed gas of a fluorocarbon gas and a hydrofluoroether represented by chemical formula (I), faceting of shoulders formed by a non-processing target can be sufficiently inhibited.

In the presently disclosed plasma etching method, a mixing ratio of the hydrofluoroether gas in the processing gas is preferably at least 1 part by volume and not more than 100 parts by volume relative to 100 parts by volume of the fluorocarbon gas. This is preferable because selectivity in etching can be improved and faceting can be further inhibited.

Moreover, in the presently disclosed plasma etching method, the fluorocarbon gas is preferably a gas of a compound represented by a compositional formula $C_2F_6$, $C_3F_6$, $C_3F_8$, $C_4F_6$, $C_4F_8$, or $C_5F_8$. This is preferable because selectivity in etching can be improved.

Furthermore, in the presently disclosed plasma etching method, the hydrofluoroether gas is preferably a gas of a compound represented by a compositional formula $C_4H_3F_7O$. This is preferable because faceting can be more sufficiently inhibited and selectivity in etching can be improved when the hydrofluoroether gas is a gas of a compound represented by a compositional formula $C_4H_3F_7O$.

Advantageous Effect

According to the present disclosure, it is possible to provide a plasma etching method that can sufficiently inhibit faceting during plasma etching of a silicon oxide film.

BRIEF DESCRIPTION OF THE DRAWINGS

In the accompanying drawings.

DETAILED DESCRIPTION

Figure 1:
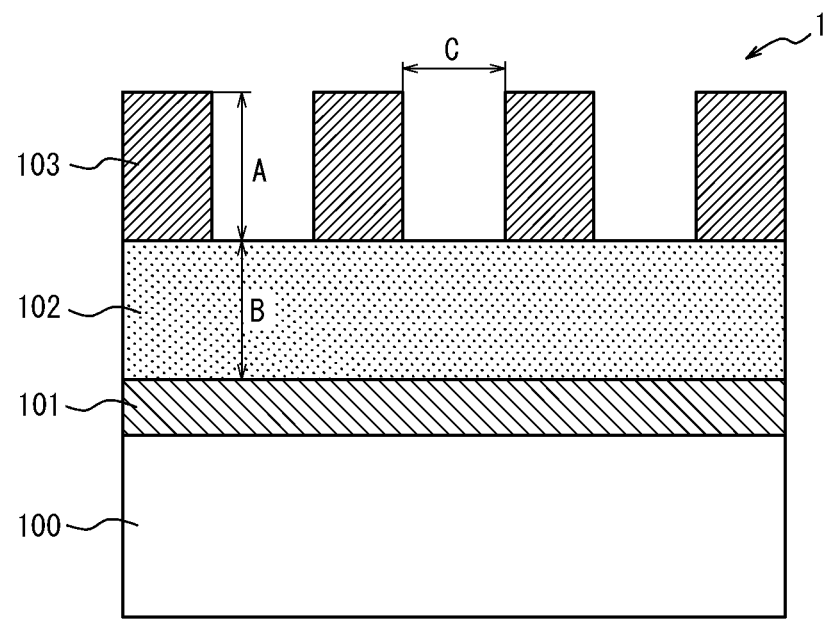
FIG. 1 is a schematic cross-sectional view illustrating a workpiece including a patterned silicon nitride film and a silicon oxide film that was used in examples and comparative examples.

The following provides a detailed description of embodiments of the present disclosure. The presently disclosed plasma etching method can be used in formation of a self-aligned contact (SAC) in a manufacturing process of a semiconductor device. The presently disclosed plasma etching method is a method of plasma etching a workpiece including a silicon oxide film that is a processing target and a non-processing target using, as a processing gas, a mixed gas of at least one fluorocarbon gas and at least one hydrofluoroether gas having a specific structure. The workpiece may be any type of target without any specific limitations so long as it can be used in plasma etching. For example, the workpiece may include a glass substrate, a monocrystalline silicon wafer, or a gallium arsenide substrate. Moreover, the workpiece may, for example, include a silicon nitride film, a silicon oxide film, and/or an organic film formed, as necessary, on a monocrystalline silicon wafer.

In the present specification, the term "silicon nitride film" refers to a film formed from a nitrogen atom-containing silicon compound such as $Si_3N_4$ (SiN), SiCN, or SiBCN. Moreover, the term "silicon oxide film" as used in the present specification refers to a film formed from an oxygen atom-containing silicon compound such as $SiO_2$, SiOC, or SiOCH. Furthermore, the term "organic film" as used in the present specification refers to a film having carbon as a main component. Note that "having carbon as a main component" means that the proportion in which carbon is contained in a material forming the film is more than 50 mass %. Specifically, this refers to a carbon based-material such as amorphous carbon or a film formed from a photoresist composition or the like (hereinafter, also referred to as a resist film).

Moreover, in the presently disclosed plasma etching method, "etching" refers to a technique that is used in a manufacturing process of a semiconductor device or the like for engraving a highly integrated fine pattern in a workpiece including a processing target and a non-processing target. Also, "plasma etching" refers to a technique in which a high-frequency electric field is applied to a processing gas to cause a glow discharge, the processing gas dissociates into chemically active ions, electrons, and neutral species, and etching is performed using chemical reactions and reactions through physical impact of these active species and an etching target material.

(Processing gas)
The processing gas includes at least one fluorocarbon gas and at least one hydrofluoroether gas having a specific structure, and may optionally include other gases.

<Fluorocarbon Gas>
Examples of fluorocarbon gases that may be used include gases of compounds represented by compositional formulae $C_2F_6$, $C_3F_6$, $C_3F_8$, $C_4F_6$, $C_4F_8$, and $C_5F_8$. Under plasma conditions, active species are generated from these compounds and various reactions occur through interactions between the generated active species. Accordingly, the effects of the presently disclosed plasma etching method can be achieved with compounds represented by these compositional formulae regardless of the actual structure thereof. One of these fluorocarbon gases may be used individually, or two or more of these fluorocarbon gases may be used as a mixture. Of these fluorocarbon gases, a compound represented by a compositional formula $C_4F_6$ is preferable, and hexafluoro-1,3-butadiene is particularly preferable. This is because compounds represented by a compositional formula $C_4F_6$, and particularly hexafluoro-1,3-butadiene, have a sufficiently high etching rate with respect to a silicon oxide film and have a large effect of inhibiting faceting of a silicon nitride film.

<Hydrofluoroether Gas>
A gas of a hydrofluoroether represented by the following chemical formula (I) is used as the hydrofluoroether gas.

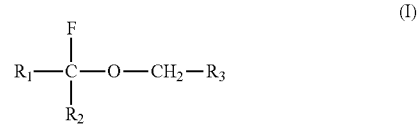

[In chemical formula (I): $R_1$ represents a hydrogen atom, a fluorine atom, or a fluoroalkyl group $C_xF_{2x+1}$; $R_2$ represents a hydrogen atom, a fluorine atom, or a fluoroalkyl group $C_yF_{2y+i}$; and $R_3$ represents a hydrogen atom, a fluorine atom, or a fluoroalkyl group $C_zF_{2z+1}$. Moreover, x, y, and z are each an integer of at least 0 and not more than 3 and satisfy $1 \le x+y+z \le 3$. Furthermore, $R_1$, $R_2$, and $R_3$ may be the same or different.]

Examples of hydrofluoroether gases represented by the preceding chemical formula (I) include gases of $CF_3$—O—$CH_2$—$C_2F_5$, $CF_3$—O—$CH_2$-n-$C_3F_7$, $CF_3$—O—$CH_2$-i-$C_3F_7$, $C_2F_5$—O—$CH_2$—$CF_3$, $C_2F_5$—O—$CH_2$—$C_2F_5$, n-$C_3F_7$—O—$CH_3$, and i-$C_3F_7$—O—$CH_3$. One of these hydrofluoroether gases may be used individually, or two or more of these hydrofluoroether gases may be used as a mixture. Of these hydrofluoroether gases, a gas of n-$C_3F_7$—O—$CH_3$ (1,1,2,2,3,3,3-heptafluoropropyl methyl ether) and/or i-$C_3F_7$—O—$CH_3$ (heptafluoroisopropyl methyl ether) is preferable. This is because these gases have a sufficiently high etching rate with respect to a silicon oxide film and a large effect of inhibiting faceting of a silicon nitride film.

As clearly shown by the preceding chemical formula (I), a feature of the constituent hydrofluoroether of the hydrofluoroether gas is that carbon that is not bonded to an oxygen atom is not bonded to both fluorine and hydrogen. In other words, a feature is that the hydrofluoroether has a structure where, in a case in which a single carbon is bonded to both fluorine and hydrogen, the carbon is also bonded to an oxygen atom. Although it is not clear why an effect of inhibiting faceting can be achieved through a gas of a hydrofluoroether having this structure, the reason is presumed to be as follows.

Firstly, in a case in which fluorine and hydrogen are present on the same carbon, radicals and ions represented by a structure $C_\alpha H_\gamma F_\beta$ ($\alpha$, $\gamma$, and $\beta$ are each a positive integer) are generated. These active species readily react with a silicon nitride film to etch the silicon nitride film. On the other hand, in a case in which oxygen is present in addition to fluorine and hydrogen on the same carbon, the carbon is in an extremely electron deficient state and hydrogen readily dissociates therefrom. This facilitates generation of radicals and ions represented by structures $C_\alpha F_\beta$ ($\alpha$ and $\beta$ are each a positive integer) and $C_\alpha F_\beta O$, which have comparatively low reactivity with a silicon nitride film. On the other hand, dissociated hydrogen ions and hydrogen radicals readily react with fluorine radicals and fluorine ions originating from the at least one fluorocarbon gas or the like included in the processing gas to produce HF and lose their reactivity, and may be discharged out of the reaction system. Since fluorine radicals and fluorine ions also have high reactivity with a silicon nitride film, the loss of reactivity thereof and further discharge out of the system can improve the etching selectivity ratio of a processing target in a situation in which a silicon nitride film is a non-processing target. Moreover, ions represented by a structure $C_\alpha F_\beta O$ have an effect of supplying oxygen atoms to the bottom of a structure formed in a workpiece. In a situation in which only oxygen gas is mixed in the processing gas as an oxygen atom source, oxygen-containing components present in a processing vessel are mainly oxygen radicals, and these oxygen radicals react with some target and lose their reactivity, for example, before these oxygen radicals can reach the bottom of a structure formed in a workpiece. Consequently, oxygen atoms cannot reach the bottom of the structure, and the plasma etching process stops partway through. It is presumed that for the reasons described above, when the processing gas includes a gas of a hydrofluoroether having a structure in which carbon that is not bonded to an oxygen atom is not bonded to both fluorine and hydrogen, an etching process can be favorably carried out while also improving the etching selectivity ratio of a processing target in a situation in which a silicon nitride film is a non-processing target.

In addition to radicals and ions represented by a structure $C_\alpha F_\beta$ ($\alpha$ and $\beta$ are each a positive integer), radicals and ions represented by a structure $CH_\delta$ ($\delta$ is a positive integer) are also easily generated from a hydrofluoroether having a structure in which carbon that is not bonded to an oxygen atom is not bonded to both fluorine and hydrogen. Since active species such as $C_\alpha F_\beta$ and $CH_\delta$ radicals and ions have lower reactivity than $C_\alpha H_\gamma F_\beta$ with a silicon nitride film, the etching selectivity ratio of a processing target (for example, a silicon oxide film) in a situation in which a silicon nitride film is a non-processing target can be increased. Moreover, since strong hydrogen bonds can be formed between hydrogen atoms and fluorine atoms, $CH_\delta$ is readily adsorbed onto a protective film with $C_\alpha F_\beta$ as a precursor. It is presumed that, as a result, a protective film formed on side surfaces and shoulders of a non-processing target silicon nitride film is stronger and thicker than a protective film formed from only $C_\alpha F_\beta$, and faceting of the non-processing target silicon nitride film can be inhibited.

Note that the preceding explanation assumes that the non-processing target is a silicon nitride film in description of the improvement in etching selectivity ratio and ability to inhibit faceting achieved through inclusion, in the processing gas, of a hydrofluoroether having a structure in which carbon that is not bonded to an oxygen atom is not bonded to both fluorine and hydrogen. However, active species having high reactivity with a non-processing target such as set forth above, and particularly fluorine radicals and fluorine ions, also have high reactivity with other non-processing targets such as organic films. It is presumed, therefore, that a hydrofluoroether represented by chemical formula (I) that can generate hydrogen ions and hydrogen radicals, and thereby deactivate fluorine radicals and fluorine ions can advantageously protect not only silicon nitride films, but also other non-processing targets such as organic films. Moreover, it is presumed that even in a case in which an organic film is a non-processing target, $CH_\delta$ is readily adsorbed onto a protective film with $C_\alpha F_\beta$ as a precursor, a strong and thick protective film can be formed on side surfaces and shoulders of the non-processing target organic film, and faceting can be inhibited.

[Mixing Ratio of Fluorocarbon Gas and Hydrofluoroether Gas]

The mixing ratio of the hydrofluoroether gas relative to the fluorocarbon gas varies depending on the etching conditions and so forth but, relative to 100 parts by volume of the fluorocarbon gas, is preferably 1 part by volume or more, more preferably 3 parts by volume or more, even more preferably 5 parts by volume or more, and further preferably 30 parts by volume or more, and is preferably 100 parts by volume or less, more preferably 90 parts by volume or less, and even more preferably 80 parts by volume or less. This is because selectivity in etching can be improved and faceting can be further inhibited.

<Other Gases>

Another gas such as a noble gas or oxygen gas may optionally be mixed into the processing gas. The noble gas may, for example, be one or more selected from the group consisting of helium, argon, neon, krypton, and xenon. Through mixing and use of a noble gas or oxygen gas, it is possible to implement plasma etching in which a more sufficient etching rate and a higher etching selectivity ratio relative to a non-processing target are simultaneously achieved.

[Mixing Ratio of Noble Gas]

In a case in which a noble gas is mixed into the processing gas, the mixing ratio of the noble gas relative to 100 parts by volume of the fluorocarbon gas is normally 1 part by volume or more, preferably 10 parts by volume or more, and more preferably 20 parts by volume or more, and is normally 10,000 parts by volume or less, preferably 7,000 parts by volume or less, and more preferably 5,000 parts by volume or less.

[Mixing Ratio of Oxygen Gas]

In a case in which oxygen gas is mixed into the processing gas, the mixing ratio of the oxygen gas relative to 100 parts by volume of the fluorocarbon gas is normally 2,000 parts by volume or less, preferably 1,000 parts by volume or less, more preferably 500 parts by volume or less, and even more preferably 300 parts by volume or less.

Gases used as the processing gas such as the fluorocarbon gas, the hydrofluoroether gas, and the optionally used noble gas, oxygen gas, or the like are normally each independently filled into a container such as a gas cylinder, transported, and installed in connection with dry etching equipment (dry etching chamber). Valves of the gas cylinders or the like are then opened so as to introduce the gases, in a specific ratio, into a dry etching chamber in which the action of plasma is received, and then dry etching is carried out through the action of plasma on each gas as subsequently described.

(Flow of Plasma Etching Method)

The flow of the presently disclosed plasma etching method is as follows. The flow is the same in cases such as when the workpiece is a patterned workpiece in which a silicon oxide film and a resist film have been formed and when the workpiece is a patterned workpiece in which a silicon nitride film, a silicon oxide film, and a resist film have been formed on the same substrate. Note that "patterned" refers to a state in which any type of structure has been formed by a film formed on the workpiece. For example, a workpiece such as illustrated in FIG. 1 is equivalent to a "patterned workpiece". More detailed description of FIG. 1 is provided in the EXAMPLES section.

[Preparation Step]

First, the workpiece is set inside a dry etching chamber (hereinafter, also referred to as a processing vessel) including a plasma generator, and the inside of the processing vessel is placed in a vacuum state by degassing. The temperature of the workpiece in the preparation step is preferably −50° C. or higher, more preferably −20° C. or higher, and even more preferably 0° C. or higher, and is preferably +120° C. or lower, more preferably +100° C. or lower, and even more preferably +80° C. or lower. The temperature of the workpiece can be controlled, for example, using a cooling apparatus and a cooling gas such as helium gas. The various gases included in the used processing gas are introduced into the processing vessel such as to each have a specific rate and pressure. The introduction rate of the processing gas may be determined in proportion to the mixing ratio of the various gases in the processing gas. It is normally preferable that the pressure inside the processing vessel is maintained with a range of 1 Pa to 13 Pa while the processing gas is being supplied into the processing vessel.

[Plasma Etching Step]

Next, the plasma generator applies a high-frequency electric field to the processing gas inside the processing vessel to cause glow discharge and generate plasma. The plasma generator may be, but is not specifically limited to, a typical plasma generator such as a helicon wave plasma generator, a high-frequency induction plasma generator, a parallel plate plasma generator, a magnetron plasma generator, or a microwave plasma generator. In the present disclosure, parallel plate plasma generators, high-frequency induction plasma generators, and microwave plasma generators can suitably be used. This is because high-density region plasma can easily be generated.

No specific limitations are placed on the plasma etching conditions, and conventional and commonly known etching conditions may be adopted. For example, in a case in which a high-frequency plasma etching apparatus is used in which an upper electrode of a parallel plate plasma generator is 60 MHz, a lower electrode of the plasma generator is 2 MHz, and separation between the electrodes is 35 mm, a combination for which supplied power to the upper electrode is within a range of 100 W to 2,000 W and supplied power to the lower electrode is within a range of 0 W to 600 W may be freely selected. The duration of the plasma etching step is normally 5 seconds to 5 minutes, and preferably 10 seconds to 4 minutes.

Moreover, the presently disclosed plasma etching method preferably has an etching rate of 260 nm/min or more. This etching rate is at least as high as the etching rate normally obtained when etching is performed through a mixed gas of $C_4F_6$ and oxygen, which has most commonly been used as a processing gas in etching of silicon oxide films in recent years.

EXAMPLES

The following provides a more detailed description of the present disclosure through examples and comparative examples. However, the present disclosure is not in any way limited by the following examples, and the type of processing gas, etching conditions, and so forth may be altered to an extent that does not deviate from the essence of the present disclosure. A workpiece and a plasma etching apparatus used in the examples and comparative examples were as follows. Moreover, plasma etching conditions adopted in the examples and comparative examples were as described below. Furthermore, etching depth, faceting resistance, and etching selectivity ratio were measured and evaluated as described below in the examples and comparative examples.

<Workpiece>

Figure 2:
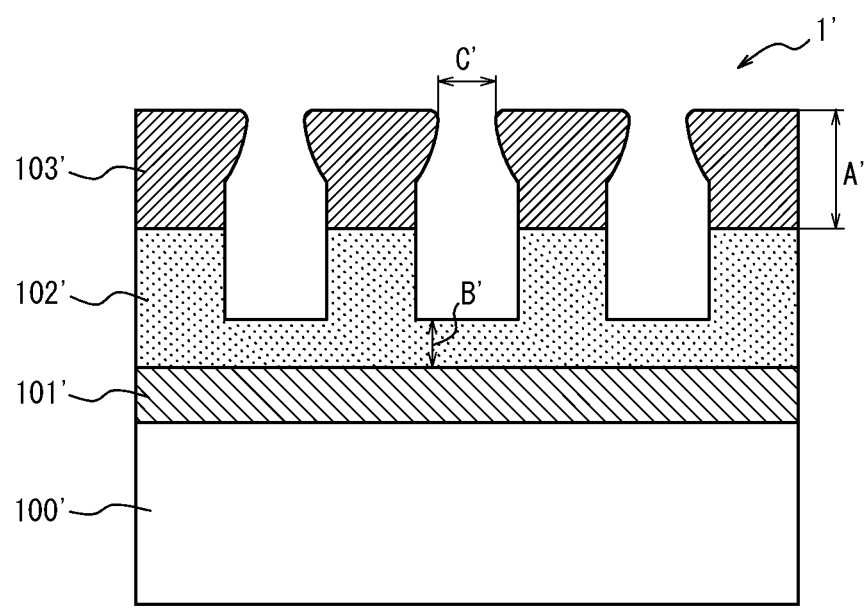
FIG. 2 is a schematic cross-sectional view illustrating a state after a laminate illustrated in FIG. 1 is etched by a plasma etching method in accordance with Example 1 of the present disclosure.

A chip piece of a monocrystalline silicon wafer having a structure illustrated in FIG. 1 was used as a workpiece. A workpiece 1 illustrated in FIG. 1 includes a first silicon nitride film ($Si_3N_4$ film) 101, a silicon oxide film ($SiO_2$ film) 102, and a patterned second silicon nitride film ($Si_3N_4$ film) 103 laminated in this order on a monocrystalline silicon wafer (Si) 100. The second silicon nitride film 103 forming an uppermost layer of the workpiece 1 forms a groove shaped pattern of fixed width. FIG. 2 is a schematic cross-sectional view illustrating the workpiece after plasma etching in accordance with Example 1 of the present disclosure. The workpiece illustrated in FIG. 2 includes each film in the same way as the pre-plasma etching workpiece illustrated in FIG. 1. Parts that are the same as in FIG. 1 are indicated by adding an apostrophe (') to the same reference sign. The sizes of various structures are indicated as arrows A' to C' in FIG. 2. The arrows A and A' respectively indicate the thickness of the pre-plasma etching second silicon nitride film 103 and the thickness of the post-plasma etching second silicon nitride film 103'. The arrow B indicates the thickness of the pre-plasma etching silicon oxide film 102 and the arrow B' indicates the thickness of the remaining post-plasma etching silicon oxide film 102'. The arrow C indicates the groove width at the outermost surface of the second silicon nitride film 103 (hereinafter, also referred to as the "entry dimension" of the pattern) and the arrow C' indicates the entry dimension in the post-plasma etching second silicon nitride film 103'. In FIG. 2, the groove width is illustrated as having narrowed from C to C' in the post-plasma etching workpiece 1' compared to the pre-plasma etching workpiece 1. However, in a plasma etching method in accordance with a comparative example, for example, the groove width C' is generally wider than the original groove width C.

<Plasma Etching Apparatus>

A plasma etching apparatus including a parallel plate plasma generator was used as the plasma etching apparatus. The parallel plate plasma generator included an upper electrode and a lower electrode on which the workpiece was placed. The separation between a lower surface of the upper electrode and an upper surface of the lower electrode was 35 mm. Moreover, the frequency of the upper electrode of the parallel plate plasma generator was 60 MHz and the frequency of the lower electrode of the parallel plate plasma generator was 2 MHz. The lower electrode included a cooling unit that was configured to cool the lower electrode through contacting of helium gas with the lower electrode. Note that the cooling unit was configured such that helium gas did not leak into the processing vessel.

<Plasma Etching Conditions>

In the plasma etching, power of the upper electrode was set as 150 W, power of the lower electrode was set as 500 W, pressure inside the chamber was maintained constant at 2 Pa, and cooling of the lower electrode was performed by setting the cooling unit to 60° C. and the pressure of helium gas as 1,000 Pa. The plasma etching time was set as 60 seconds in all of the examples and comparative examples. Accordingly, a value for the etching depth of the workpiece obtained in each example and comparative example corresponds to the etching rate per 1 minute of the corresponding plasma etching method.

<Etching Depth>

Measurement was performed in the examples and comparative examples using a commercially available ellipsometry film thickness meter. The etching depth of the processing target silicon oxide film was calculated from a difference (B-B') between the thickness of the pre-plasma etching silicon oxide film 102 and the thickness of the post-plasma etching silicon oxide film 102' described with reference to FIGS. 1 and 2. Moreover, the etching depth of the non-processing target second silicon nitride film was calculated in the same way from "A-A'".

<Faceting Resistance>

The amount of enlargement of the entry dimension serving as an evaluation index for faceting resistance was calculated from "C'-C" explained with reference to FIGS. 1 and 2. Note that the amount of enlargement of the groove width is obviously a negative value in a case in which C' is smaller than C (i.e., in a case in which the groove width narrows through plasma etching). Moreover, in a case in which C' is larger than C, this signifies that etching of the non-processing target second silicon nitride film and faceting have occurred in plasma etching, and a larger value therefor indicates a greater degree of faceting. In other words, a small value for the amount of enlargement of the entry dimension signifies excellent faceting resistance, whereas a large value for the amount of enlargement of the entry dimension signifies poor faceting resistance.

The post-plasma etching entry dimension C' was obtained by acquiring a scanning electron microscope (SEM) image of the outermost surface of the workpiece as determined by SEM observation, and then measuring the groove width in the acquired SEM image.

<Etching Selectivity Ratio>

The etching selectivity ratio of the silicon oxide film relative to the silicon nitride film was taken to be a value calculated by dividing the etching depth (B-B') of the silicon oxide film (102) by the etching depth (A-A') of the silicon nitride film (103).

Moreover, the selectivity ratio relative to the entry dimension was taken to be a value obtained by dividing the etching depth (B-B') of the silicon oxide film (102) by the amount of enlargement (C'-C) of the entry dimension. The "selectivity ratio relative to the entry dimension" indicates the degree of etching of the silicon oxide film performed while maintaining the entry dimension of the silicon nitride film, and a larger value therefor represents a favorable balance of etching selectivity of the silicon oxide film relative to the silicon nitride film and faceting resistance. Note that in a case in which the enlargement width of the entry dimension was a value of zero or less, the selectivity ratio relative to the entry dimension was defined as being infinitely large (cc).

Example 1

<Processing Gas>

Hexafluoro-1,3-butadiene ($C_4F_6$) as a fluorocarbon gas at a rate of 10 sccm, oxygen gas as another gas at a rate of 10 sccm, heptafluoroisopropyl methyl ether (i-$C_3F_7$—O—$CH_3$) as a hydrofluoroether gas at a rate of 5 sccm, and argon gas as a noble gas at a rate of 200 sccm were introduced into the processing vessel of the plasma etching apparatus. Results of various measurements of the resultant workpiece that were performed in accordance with the previously described methods are shown in Table 1.

Example 2

Plasma etching was performed in the same way as in Example 1 with the exception that the hydrofluoroether gas was changed to 1,1,2,2,3,3,3-heptafluoropropyl methyl ether (n-$C_3F_7$—O—$CH_3$). Results of various measurements of the resultant workpiece that were performed in accordance with the previously described methods are shown in Table 1.

Example 3

Plasma etching was performed in the same way as in Example 1 with the exception that the hydrofluoroether gas was changed to 2,2,2-trifluoroethyl difluoromethyl ether ($CF_3$—$CH_2$—O—$CHF_2$). Results of various measurements of the resultant workpiece that were performed in accordance with the previously described methods are shown in Table 1.

Comparative Example 1

Plasma etching was performed in the same way as in Example 1 with the exception that a hydrofluoroether gas was not used. Results of various measurements of the resultant workpiece that were performed in accordance with the previously described methods are shown in Table 1.

Comparative Example 2

Plasma etching was performed in the same way as in Example 1 with the exception that the hydrofluoroether gas was changed to 1,1,2,2-tetrafluoroethyl methyl ether ($CHF_2$—$CF_2$—O—$CH_3$). Results of various measurements of the resultant workpiece that were performed in accordance with the previously described methods are shown in Table 1.

Comparative Example 3

Plasma etching was performed in the same way as in Example 1 with the exception that the hydrofluoroether gas was changed to hexafluoropropylene oxide ($C_3F_6O$). Results of various measurements of the resultant workpiece that were performed in accordance with the previously described methods are shown in Table 1.

Comparative Example 4

Plasma etching was performed in the same way as in Example 1 with the exception that the hydrofluoroether gas was changed to octafluorotetrahydrofuran ($C_4F_8O$). Results of various measurements of the resultant workpiece that were performed in accordance with the previously described methods are shown in Table 1.

Comparative Example 5

Plasma etching was performed in the same way as in Example 1 with the exception that the hydrofluoroether gas was changed to heptafluorocyclopentene ($C_5HF_7$). Results of various measurements of the resultant workpiece that were performed in accordance with the previously described methods are shown in Table 1.

etching depth of the silicon oxide film (102) was 319 nm and 306 nm, respectively, which is deeper than in Examples 1 to 3, and a fast etching rate was achieved, but the selectivity ratio relative to the entry dimension was noticeably poorer than in Examples 1 to 3. These results demonstrate that fluoroethers that do not include hydrogen in their molecular structure are not appropriate as the processing gas. In Comparative Example 5 in which $C_5HF_7$, which is a hydrofluorocarbon in which a hydrogen atom and a fluorine atom are not present on the same carbon, was used as the processing gas, both the etching depth of the silicon oxide

TABLE 1

|  | Processing gas | | | | Measured values | | | | |
|---|---|---|---|---|---|---|---|---|---|
|  | Fluorocarbon gas | | Hydrofluoroether gas | | Etching depth | Etching depth | faceting resistance Amount of | Etching selectivity ratio [—] | |
|  |  |  |  |  |  |  |  | Selectivity ratio | Selectivity ratio |
|  | Type | Mixing ratio [parts by volume] | Type | Mixing ratio [parts by volume] | of $SiO_2$ film [nm] | of $Si_3N_4$ film [nm] | enlargement of entry dimension [nm] | relative to $Si_3N_4$ film [—] | relative to entry dimension [—] |
| Example 1 | $C_4F_6$ | 100 | $C_4H_3F_7O$ | 50 | 261 | 118 | −35 | 2.2 | ∞ |
| Example 2 | $C_4F_6$ | 100 | $C_4H_3F_7O$ | 50 | 267 | 144 | −28 | 1.9 | ∞ |
| Example 3 | $C_4F_6$ | 100 | $C_3H_3F_5O$ | 50 | 293 | 144 | 5 | 2.0 | 58.6 |
| Comparative Example 1 | $C_4F_6$ | 100 | — | 50 | 267 | 144 | 31 | 1.9 | 8.6 |
| Comparative Example 2 | $C_4F_6$ | 100 | $C_3H_4F_4O$ | 50 | 208 | 92 | 50 | 2.3 | 4.2 |
| Comparative Example 3 | $C_4F_6$ | 100 | $C_3F_6O$ | 50 | 319 | 170 | 18 | 1.9 | 18 |
| Comparative Example 4 | $C_4F_6$ | 100 | $C_4F_8O$ | 50 | 306 | 170 | 37 | 1.8 | 8.3 |
| Comparative Example 5 | $C_4F_6$ | 100 | $C_5HF_7$ | 50 | 97 | 92 | 57 | 1.1 | 1.7 |

The following can be understood from Table 1. Firstly, a plasma etching method in which a mixed gas of at least one fluorocarbon gas and at least one hydrofluoroether gas having a specific structure is used as a processing gas as in Examples 1 to 3 has excellent faceting resistance. Note that although a workpiece in which a groove-shaped pattern had been formed was used in the examples and comparative examples, the results of evaluation based on this workpiece are also presumed to be applicable to a hole-shaped structure such as an SAC.

Specifically, in Examples 1 and 2, an infinity large selectivity ratio relative to the entry dimension was achieved while maintaining the etching depth of the silicon oxide film (102) at 260 nm or more. In Example 3, a high selectivity ratio relative to the entry dimension of 58.6 was achieved while maintaining the etching depth of the silicon oxide film (102) at 260 nm or more. On the other hand, although Comparative Example 1 had a similar etching depth to Examples 1 and 2, the selectivity ratio relative to the entry dimension was 8.6, and etching of shoulders of the silicon nitride film occurred. Therefore, mixing of a hydrofluoroether gas can significantly enhance the selectivity ratio relative to the entry dimension compared to when only a fluorocarbon gas is used.

In Comparative Example 2, both the etching depth of the silicon oxide film (102) and the selectivity ratio relative to the entry dimension were noticeably poorer than in Examples 1 to 3.

In Comparative Examples 3 and 4 in which a fluoroether gas that did not include hydrogen atoms was used, the film (102) and the selectivity ratio relative to the entry dimension were poorer than in Comparative Example 1. These results demonstrate that it is necessary for the processing gas to include a hydrofluoroether gas that includes an ether bond in molecules thereof.

INDUSTRIAL APPLICABILITY

According to the present disclosure, it is possible to inhibit faceting of a silicon nitride film by using, as a processing gas, a mixed gas of a fluorocarbon gas and a hydrofluoroether gas satisfying chemical formula (I) such as set forth above.

REFERENCE SIGNS LIST

1, 1' workpiece
100, 100' monocrystalline silicon wafer
101, 101' first silicon nitride film
102, 102' silicon oxide film
103, 103' patterned second silicon nitride film
A thickness of pre-plasma etching second silicon nitride film 103
A' thickness of post-plasma etching second silicon nitride film 103'
B thickness of pre-plasma etching silicon oxide film 102
B' thickness of remaining post-plasma etching silicon oxide film 102'
C entry dimension of pattern formed in second silicon nitride film 103

C' entry dimension in post-plasma etching second silicon nitride film 103'

The invention claimed is:

1. A plasma etching method comprising plasma etching a workpiece including a silicon oxide film that is a processing target and a non-processing target using, as a processing gas, a mixed gas of at least one fluorocarbon gas and at least one hydrofluoroether gas represented by chemical formula (I)

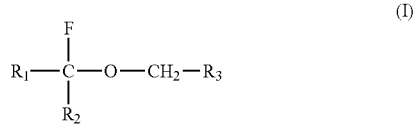
(I)

wherein, in chemical formula (I): $R_1$ represents a hydrogen atom, a fluorine atom, or a fluoroalkyl group $C_xF_{2x+1}$; $R_2$ represents a hydrogen atom, a fluorine atom, or a fluoroalkyl group $C_yF_{2y+1}$; and $R_3$ represents a hydrogen atom, a fluorine atom, or a fluoroalkyl group $C_zF_{2z+1}$, where x, y, and z are each an integer of at least 0 and not more than 3 and satisfy $1 \leq x+y+z \leq 3$, and $R_1$, $R_2$, and $R_3$ may be the same or different.

2. The plasma etching method according to claim 1, wherein
a mixing ratio of the hydrofluoroether gas in the processing gas is at least 1 part by volume and not more than 100 parts by volume relative to 100 parts by volume of the fluorocarbon gas.

3. The plasma etching method according to claim 1, wherein
the fluorocarbon gas is a gas of a compound represented by a compositional formula $C_2F_6$, $C_3F_6$, $C_3F_8$, $C_4F_6$, $C_4F_8$, or $C_5F_8$.

4. The plasma etching method according to claim 1, wherein
the hydrofluoroether gas is a gas of a compound represented by a compositional formula $C_4H_3F_7O$.

* * * * *